United States Patent
Shin et al.

(10) Patent No.: US 7,435,445 B2
(45) Date of Patent: Oct. 14, 2008

(54) METHOD FOR MANUFACTURING SEMICONDUCTOR DEVICE

(75) Inventors: Cheol Ho Shin, Chungcheongnam-do (KR); Byoung Ha Cho, Daejeon (KR); Sang Tae Sim, Chungcheongbuk-do (KR); Jung Soo Kim, Chungcheongnam-do (KR); Won Hyung Lee, Chungcheongnam-do (KR); Dae Sik Kim, Busan (KR)

(73) Assignee: Moohan Co., Ltd., Chungcheongnam-Do (KR)

( * ) Notice: Subject to any disclaimer, the term of this patent is extended or adjusted under 35 U.S.C. 154(b) by 152 days.

(21) Appl. No.: 11/376,402

(22) Filed: Mar. 15, 2006

(65) Prior Publication Data

US 2006/0177579 A1    Aug. 10, 2006

Related U.S. Application Data

(62) Division of application No. 10/661,439, filed on Sep. 11, 2003, now abandoned.

(30) Foreign Application Priority Data

Sep. 17, 2002    (KR)    ............................... 2002-56390

(51) Int. Cl.
 *C23C 16/00*    (2006.01)
(52) U.S. Cl. .................... 427/248.1; 438/913; 118/715; 118/719

(58) Field of Classification Search .................. 118/728, 118/730; 438/913; 427/248.1
See application file for complete search history.

(56) References Cited

U.S. PATENT DOCUMENTS

| 6,576,062 B2* | 6/2003 | Matsuse ...................... 118/719 |
| 6,783,627 B1* | 8/2004 | Mahawili ............... 156/345.38 |
| 6,932,871 B2* | 8/2005 | Chang et al. ................. 118/719 |
| 2008/0078325 A1* | 4/2008 | Matsuda et al. ........ 118/723 HC |

* cited by examiner

*Primary Examiner*—Walter L. Lindsay, Jr.
*Assistant Examiner*—Kenisha V Ford
(74) *Attorney, Agent, or Firm*—Bell, Boyd & Lloyd LLP

(57) ABSTRACT

Disclosed are PEALD (plasma-enhanced atomic layer deposition) apparatus and PEALD method for manufacturing a semiconductor device, the PEALD apparatus comprising: a housing including a reaction chamber in which a deposition reaction is performed; a rotary disk unit installed in the housing and provided with a plurality of susceptors for receiving wafers thereon so as to move the wafers; a gas spray unit mounted on the upper end of the housing above the rotary disk unit, and provided with first reactive gas sprayers, second reactive gas sprayers and inert gas sprayers on a lower surface of a circular disk for spraying respective gases into the housing; a gas feed unit connected to the gas spray unit for supplying first and second reactive gases and a purge gas into the housing; a gas exhaust port formed around the rotary disk unit; and a plasma generator for generating plasma to excite the second reactive gas.

7 Claims, 14 Drawing Sheets

90°

135°

METHOD FOR MANUFACTURING SEMICONDUCTOR DEVICE

CROSS REFERENCE TO RELATED APPLICATIONS

The present application is a divisional of U.S. patent application Ser. No. 10/661,439 filed on Sep. 11, 2003 now abandoned which claims priority to Korean Patent Document No. P2002-56390 filed on Sep. 17, 2002, the disclosures of which are herein incorporated by reference.

BACKGROUND

The present invention relates to an atomic layer deposition (hereinafter, referred to as "ALD") apparatus and method for manufacturing a semiconductor device, and more particularly to an ALD apparatus and an ALD method for manufacturing a semiconductor device, in which a gas feed unit has an improved structure, thus enhancing the productivity of a depositing process, allowing gases to be uniformly supplied into a reactor, achieving the depositing process at a low temperature, and improving the physiochemical properties of an obtained thin film.

Generally, various thin films are deposited on a semiconductor substrate by a sputtering method, which is a physical deposition process. However, when the surface of the substrate is stepped, a thin film deposited by the sputtering method has low step coverage. Accordingly, a chemical vapor deposition (hereinafter, referred to as "CVD") method using an organo-metallic precursor has been widely used.

Such a CVD method for depositing a thin film using a CVD apparatus has excellent step coverage of an obtained thin film and high productivity of the thin film deposition process. However, the CVD method has problems in that it requires a high temperature for depositing the thin film and has difficulty in finely controlling the thickness of the thin film to be several Å. Further, two or more kinds of reactive gases are simultaneously supplied into a reactor and chemically reacted with each other in a gaseous state, thus creating particles of contaminants.

Since semiconductor devices have been miniaturized recently, the thickness of thin films required by the semiconductor devices has decreased and it is necessary to finely control the thickness of the thin films. Particularly, in order to solve the above problems of the CVD method, there is proposed an ALD method, in which an atomic layer of an ultra-thin film is deposited to produce a dielectric layer of a semiconductor device, a transparent conductive layer of an LCD, or a protective layer of an electroluminescent thin film display.

In the above ALD method, the thin film is obtained by repeating cycles, in which reactants are separately injected into the reactor including a substrate (wafer), and chemically absorbed onto the surface of the substrate in a saturated state.

Hereinafter, the process and principle of the thin film deposition using the above ALD method will be described in detail.

FIGS. 1a to 1e are schematic views illustrating the ALD method, in which a thin film is obtained by repeating the ALD cycle twice.

First, a first reactive gas 12 is supplied onto the upper surface of a wafer 10 serving as a semiconductor substrate located within a rector. Here, the first reactive gas 12 is chemically absorbed onto the upper surface of the wafer 10 until the reaction reaches a saturated state (FIGS. 1a and 1b).

When the reaction between the first reactive gas 12 and the upper surface of the wafer 10 reaches the saturated state, the excess amount of the first reactive gas 12 no longer reacts with the upper surface of the wafer 10. Under this condition, an inert gas (not shown) reacts with the excess amount of the first reactive gas 12, thereby allowing the excess amount of the first reactive gas 12 to be exhausted to the outside (FIG. 1c).

After the first reactive gas 12 is completely removed from the reactor, a second reactive gas 14 is supplied onto the upper surface of the wafer 10, and then chemically absorbed onto the upper surface of the wafer 10. Here, the first and second reactive gases 12 and 14 are chemically reacted on the upper surface of the wafer 10, thereby being formed into a desired thin film of an atomic layer (FIG. 1d).

When the reaction between the second reactive gas 14 and the upper surface of the wafer 10 reaches a saturated state, the excess amount of the second reactive gas 14 does not react with the upper surface of the wafer 10 any more. Under this condition, an inert gas (not shown) reacts with the excess amount of the second reactive gas 12, thereby allowing the excess amount of the second reactive gas 12 to be exhausted to the outside (FIG. 1e).

The above-described steps shown in FIGS. 1a to 1e form one cycle, and the thin film of the atomic layer with a desired thickness can be grown on the wafer 10 by repeating the cycle.

In order to alternately supply the reactive gases, which are fed onto and chemically react with the upper surface of the wafer 10, a valve control unit is generally used.

FIG. 2 is a schematic cross-sectional view of a conventional ALD apparatus 20. Here, the movement of a wafer 24 is not shown.

The conventional ALD apparatus comprises a vacuum chamber 20 as a reactor, a base 22, for mounting the wafer 24 thereon, while moving upward and downward within the vacuum chamber 20, a gas suction port 26 installed at one end of the vacuum chamber 20, a gas exhaust port 28 installed at the other end of the vacuum chamber 20, and a gas feed unit 30 connected to the gas suction port 26. A heater is installed within the base 22.

Here, the gas feed unit 30 can comprise a first reactive gas container 32, a second reactive gas container 34, and a purge gas container 36 containing an inert gas depending on the types of thin films to be formed. First, second and third valves 37, 38 and 39 for controlling the flow rate of the corresponding gases are provided in the respective containers 32, 34 and 36.

In order to perform the steps shown in FIGS. 1a to 1e using the above ALD apparatus, a process cycle shown in FIG. 3 is carried out.

First, only the first valve 37 in the first reactive gas container 32 is opened so as to supply a first reactive gas into the vacuum chamber 20. When the absorption of the first reactive gas onto the wafer 24 is completed, the first valve 37 is closed and the third valve 39 is opened so as to supply a purge gas (inert gas) into the vacuum chamber 20.

After the first reactive gas is completely removed, the third valve 39 is closed and the second valve 38 in the second reactive gas container 34 is opened so as to supply a second reactive gas into the vacuum chamber 20. When the reaction between the second reactive gas and the wafer 24 is completed and a thin film is grown on the wafer 24, the second valve 38 is closed and the third valve 39 is re-opened so as to supply the purge gas into the vacuum chamber 20. Thereby, one cycle of the ALD process is completed. The thin film with a desired thickness is formed on the wafer 24 by repeating the cycle several times (FIG. 3).

The ALD process using the above conventional ALD apparatus is inevitably restricted by various requirements.

That is, a step of chemically reacting the second reactive gas with the first reactive gas absorbed onto the wafer must be performed in the low temperature range in which the first reactive gas is not dissolved on the substrate. In order to achieve the chemical reaction between the first and second reactive gases in such low temperatures, the second reactive gas must have a high reactivity, thus being limited in terms of materials to be selected.

For example, the second reactive gas with a high reactivity, which is used to form a metallic oxide thin film serving as a dielectric or electrode, is selected from vapor, ozone, etc. The use of these materials as the second reactive gas causes some unwanted problems.

Water is absorbed onto the inner wall of the reaction chamber and is not easily exhausted to the outside, thus lengthening the purging time and reducing the productivity of the ALD process. Further, water creates particles of contaminants, thereby deteriorating the uniformity and reliability of the obtained thin film. In case that ozone is used as the second reactive gas, since ozone has a high reactivity, it is difficult to induce ozone into the reaction chamber.

Further, ammonia ($NH_3$) is mainly used as the second reactive gas to form a metallic nitride thin film. Ammonia is easily absorbed onto other parts other than the substrate within the reaction chamber, thus not being easily exhausted to the outside. In case that ammonia is not completely removed from the reaction chamber, ammonia reacts with a reactive gas of the next cycle, thus generating particles of a contaminant and increasing the amount of impurities in the thin film.

Moreover, with the ALD method, it is difficult to deposit a thin film made of a single element such as W, Al, Cu, Pt, Ir, Ru, etc. on the wafer.

Accordingly, in order to solve the above problems, there has been developed a plasma-enhanced ALD (hereinafter, referred to as "PEALD") method.

In the PEALD method, a second reactive gas excited by plasma is supplied to a reaction chamber.

FIG. 3 is a graph illustrating gas supply in accordance with respective steps of the conventional ALD method.

First, a first reactive gas is supplied into the reaction chamber provided with a wafer, and absorbed onto the surface of the wafer. Then, a purge gas is supplied into the reaction chamber to remove the residual first reactive gas from the reaction chamber. Next, a second reactive gas excited by plasma generated by a plasma generator is supplied into the reaction chamber, and then acceleratedly reacts with the first reactive gas absorbed onto the substrate.

Thereafter, the plasma generation by the plasma generator is stopped and the supply of the second reactive gas is stopped. Then, a purge gas is re-supplied into the reaction chamber so that the purge gas reacts with the remaining amount of the second reactive gas, thereby removing the remaining amount of the second reactive gas from the reaction chamber.

Although the reactivity between the first and second reactive gases is low, since the second reactive gas of the PEALD method is excited by plasma, the reaction between the first and second reactive gases is easily achieved. However, in case that the plasma generator is turned on when the first reactive gas is supplied into the reaction chamber, the first reactive gas is dissolved, thus contaminating the particles of the first reactive gas or deteriorating the step coverage. Accordingly, the power supply to the plasma generator is synchronized with the gas supply cycle, such that the plasma generator is turned off when the first reactive gas is supplied into the reaction chamber, and turned on when the second reactive gas is supplied into the reaction chamber.

In order to supply the first reactive gas and the second reactive gas excited by plasma into the reaction chamber at a predetermined interval, the PEALD method employs a mode in which a plurality of valves are controlled by complicated steps. Such a complicated mode shortens the service life of the valves due to the frequent manipulation of the valves, and reduces the stability of the PEALD process due to the variation in the pressure in the reaction chamber caused by the disparity in the amount of the reactive gases and the purge gas supplied thereto.

That is, a PEALD apparatus used in the PEALD method comprises valves and a plasma system having a complicated structure and shortens the service life of the valves and the plasma system due to frequent manipulation, thereby increasing the maintenance cost and lengthening the shutdown time.

Further, the PEALD apparatus provided with the plasma generator does not comprise a mass flow controller (MFC) for electronically controlling the flow rates of the reactive gases, and has several problems such as the delay in time and speed required for manipulation of the valves.

Accordingly, since the flow rates of the reactive gases cannot be precisely controlled, the PEALD method has an unstable process.

SUMMARY

Therefore, the present invention is designed to solve the above problems, and it is an object of the present invention to provide an ALD apparatus for stably supplying reactive gases, thus improving the uniformity and quality of an obtained thin film.

It is a further object of the present invention to provide an ALD apparatus for preventing frequent on/off manipulations of valves or a plasma generator, thus preventing damage to the apparatus and reducing the maintenance time and the production cost.

It is another object of the present invention to provide an ALD apparatus for simultaneously and continuously supplying all necessary gases, thus preventing time delay due to valve manipulation and the variation in flow rates of the gases, increasing the speed of an ALD process, improving the stability of the ALD process, minimizing the on/off manipulation of the plasma generator, and preventing damage to the apparatus and the quality deterioration of an obtained thin film.

It is yet another object of the present invention to provide an ALD apparatus for simultaneously depositing a thin film of an atomic layer on a plurality of substrates, thus increasing the productivity of the ALD process.

In accordance with one aspect of the present invention, the above and other objects can be accomplished by the provision of a PEALD (plasma enhanced atomic layer deposition) apparatus comprising: a housing including a reaction chamber in which a deposition reaction is performed; a rotary disk unit installed in the housing and provided with a plurality of susceptors for receiving wafers thereon so as to move the wafers; a gas spray unit mounted on the upper end of the housing above the rotary disk unit, and provided with first reactive gas sprayers, second reactive gas sprayers and inert gas sprayers on a lower surface of a circular disk for spraying respective gases into the housing; a gas feed unit connected to the gas spray unit for supplying first and second reactive gases and a purge gas into the housing; a gas exhaust port formed around the rotary disk unit; and a plasma generator for generating plasma to excite the second reactive gas.

Preferably, the first reactive gas sprayers, the second reactive gas sprayers and the inert gas sprayers of the gas spray unit may be alternately arranged, and a purge gas exhaust port may be formed at the central portion of the gas spray unit. Further, preferably, each sprayer of the first reactive gas sprayers, the second reactive gas sprayers and the inert gas sprayers may be made of a bar-shaped member with a predetermined length corresponding to the size of the wafer, include through holes for spraying the respective gases formed in the central portion thereof along a longitudinal direction, and be opposite one another with respect to the center of the gas spray unit. Moreover, preferably, the exciting of the second reactive gas by plasma generated from the plasma generator may be performed at the outside or inside of the reactor.

In accordance with another aspect of the present invention, there is provided a PEALD method using the present PEALD apparatus, comprising the steps of: (a) mounting a plurality of wafers to be deposited with a thin film on susceptors of a rotary disk unit; (b) maintaining a deposition temperature by controlling the temperature in the housing; (c) vertically moving the rotary disk unit to a position corresponding to a gas spray unit; (d) rotating the rotary disk unit; and (e) depositing the thin film on the upper surfaces of the wafers by spraying a first reactive gas, a second reactive gas excited by plasma and an inert gas through spray holes of the gas spray unit.

Preferably, the rotary disk unit may have a rotational speed that ranges from about 5 rpm to about 100 rpm, and the inside of the housing may be maintained such that it has a pressure that ranges from about 10 mTorr to about 100 Torr and a temperature that ranges from about 25° C. to about 500° C. Further, preferably, the first reactive gas may be one selected from the group consisting of Al, Si, Ti, Ga, Ge, Co, Sr, Y, Zr, Nb, Ru, Ba, La, Hf, Ta, Ir, Pb, Bi, W, and their compounds. Moreover, preferably, the second reactive gas may comprise hydrogen gas so as to deposit a unit-element thin film on the wafers, one selected from the group consisting of $N_2$ and $NH_3$ gases so as to deposit a nitride thin film on the wafers, one selected from the group consisting of oxygen and $N_2O$ gases so as to deposit an oxide thin film on the wafers, and one selected from the group consisting of methane, ethane, and propane gases so as to deposit a carbide thin film on the wafers; and the second reactive gas may be exited by plasma and then supplied into the reactor.

Preferably, the PEALD method may further comprise an in-situ plasma-processing step after the above step (e). A gas for using at the in-situ plasma-processing step is one selected from the group consisting of Ar, $N_2$, $O_2$ and $H_2$.

Further, the PEALD method may further comprise the step of clearing the wafers with a clearing gas excited by plasma so as to remove particles or foreign substances from the surfaces of the wafers, prior to the step (e), or the in-situ clearing step of removing the thin film deposited on the inside of the reactor using the plasma system.

Additional features and advantages of the present invention are described in, and will be apparent from, the following Detailed Description of the Invention and the figures.

DETAILED DESCRIPTION

Now, preferred embodiments of the present invention will be described in detail with reference to the annexed drawings.

<PEALD apparatus>

Figure 1A:
FIGS. 1a to 1e are schematic views illustrating an ALD method.
Figure 1B:
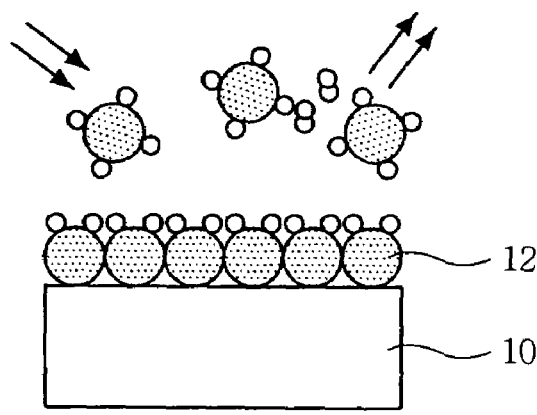
Figure 1C:
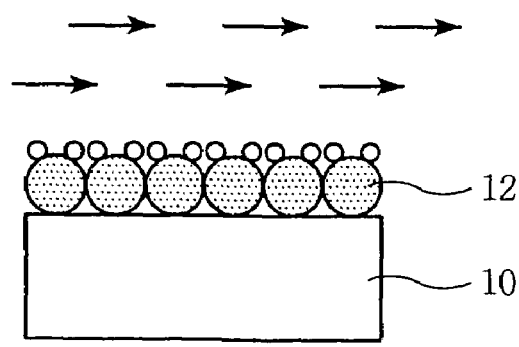
Figure 1D:
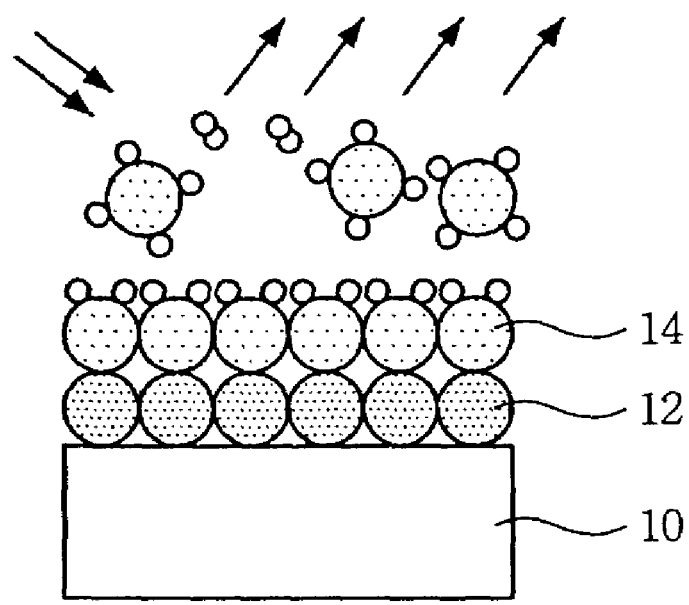
Figure 1E:
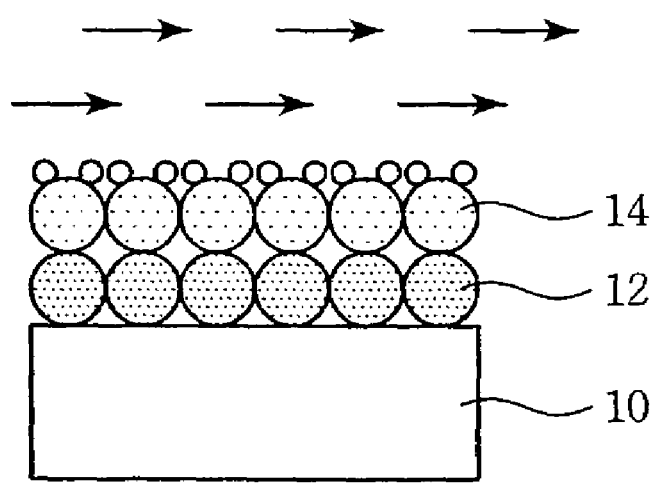
Figure 2:
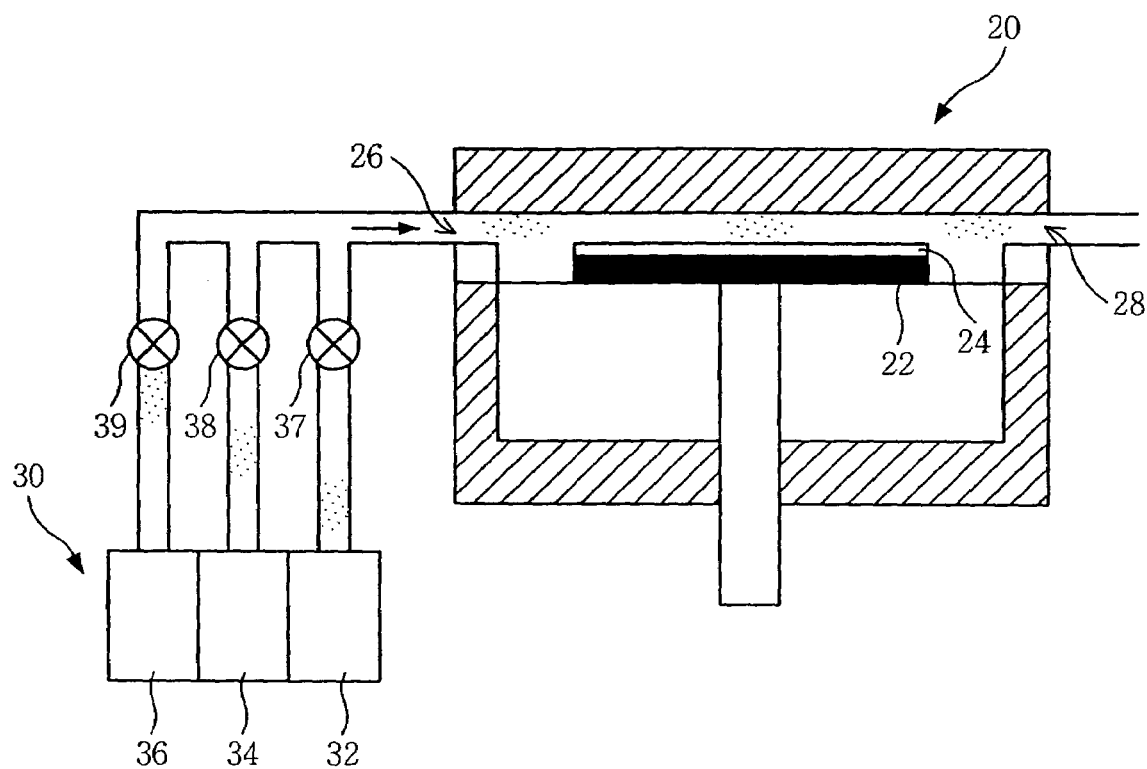
FIG. 2 is a schematic cross-sectional view of a conventional ALD apparatus.
Figure 3:
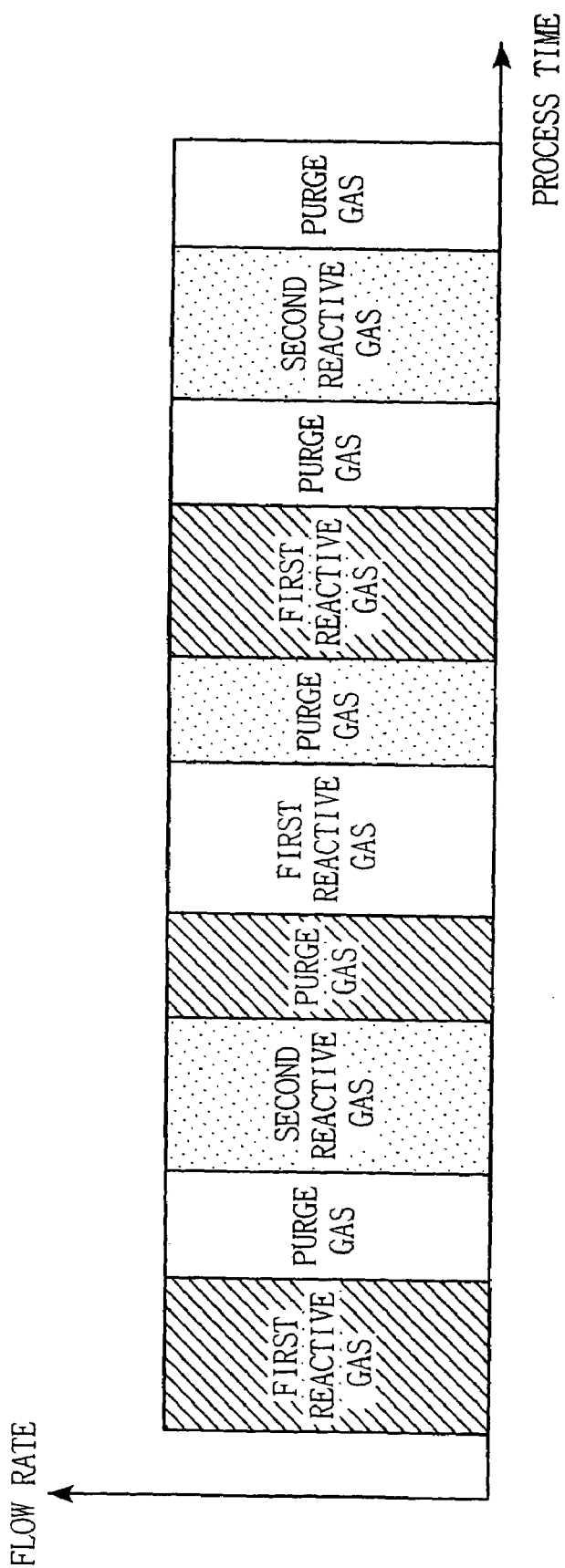
FIG. 3 is a graph illustrating flow rates of gases in accordance with respective steps of a conventional PEALD method.
Figure 4:
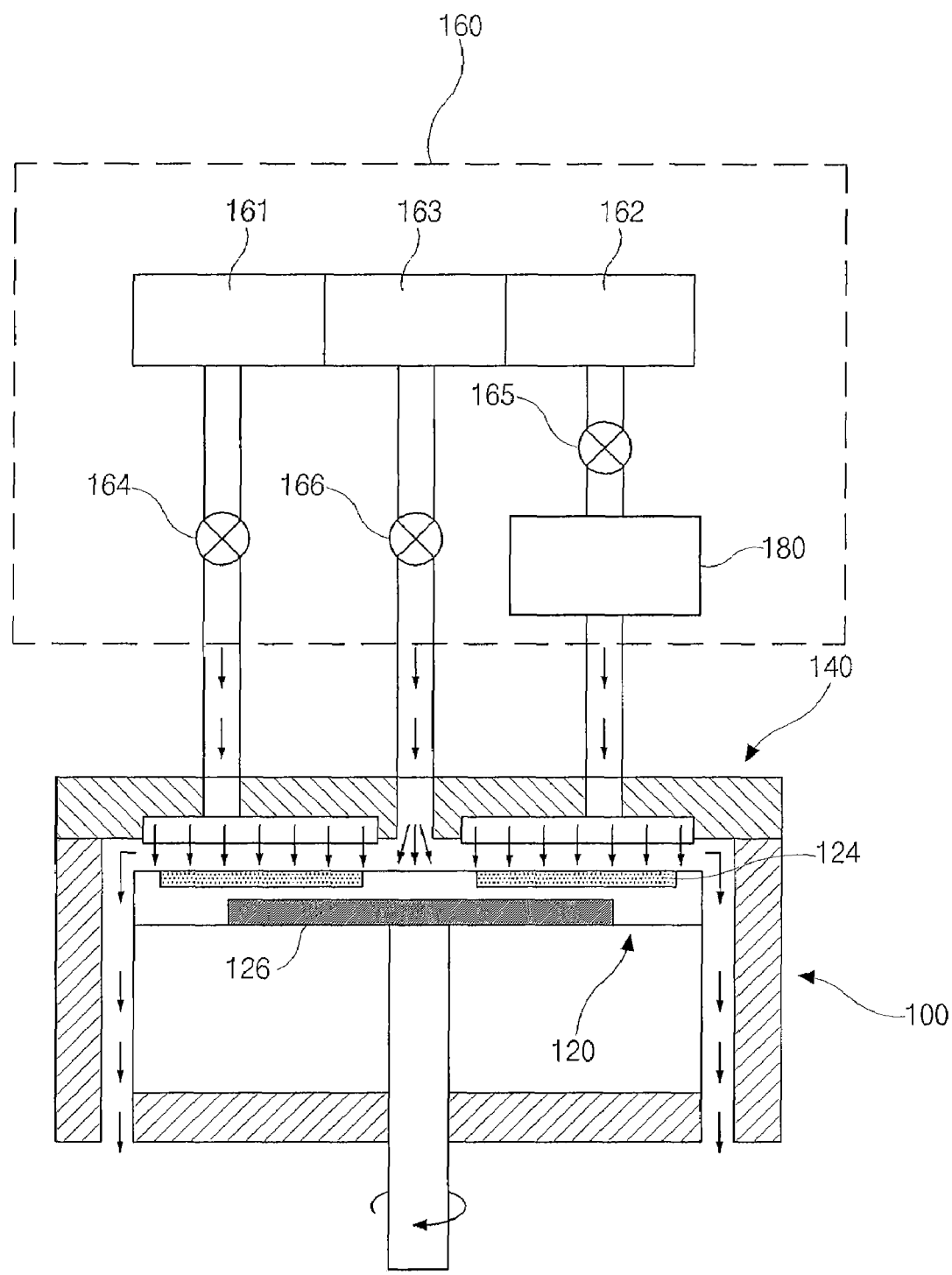
FIG. 4 is a schematic view of an ALD apparatus in accordance with the present invention.

FIG. 4 is a schematic view of a PEALD apparatus in accordance with the present invention. The PEALD apparatus comprises a housing 100, a rotary disk unit 120, a disk driving unit 126, a gas spray unit 140, a gas feed unit 160, a plasma system 180, and a gas exhaust port 190. The housing 100 provides a space of a predetermined size in which a deposition reaction is induced. The rotary disk unit 120 is rotatably installed within the housing 100 and includes a plurality of wafer susceptors 122 for receiving wafers 124. The disk driving unit 126 serves to drive the rotary disk unit 120. The gas spray unit 140 is mounted on the upper part of the housing 100 so that the gas spray unit 140 is located above the rotary disk unit 120, and serves to uniformly supply reactive or purge gases through spray holes 147 of arms 144, 145 and 146 serving as gas sprayers. The gas feed unit 160 is connected to the gas spray unit 140, and serves to feed the reactive or purge gases to the arms 144, 145 and 146. The plasma system 180 serves to generate plasma for exciting one reactive gas. The gas exhaust port 190 is formed such that the gases are exhausted from the lower part of the housing 100 to the outside through a gap surrounding the rotary disk unit 120.

Figure 5:
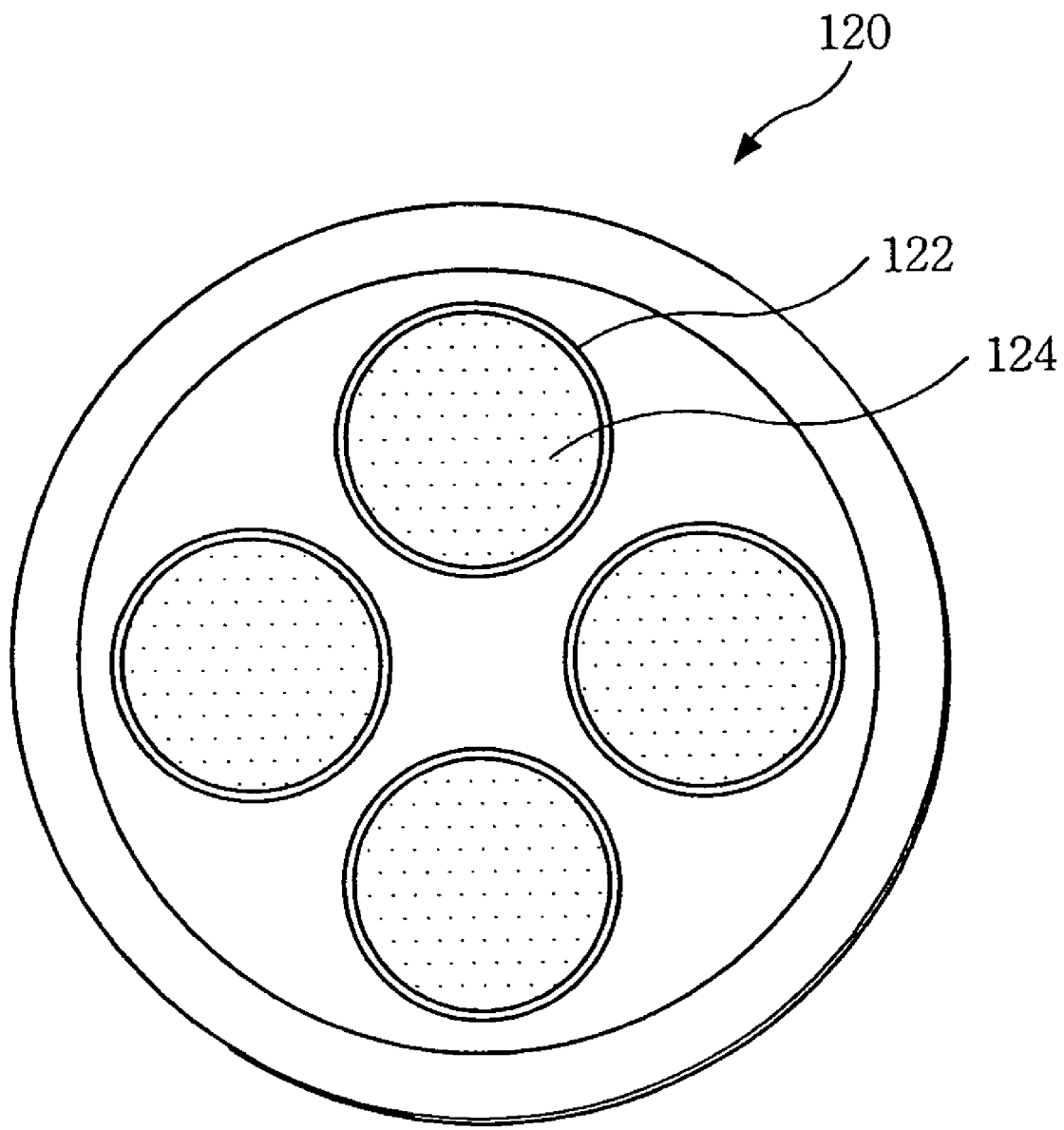
FIG. 5 is a schematic view of a rotary disk unit of the ALD apparatus of FIG. 4.

FIG. 5 is a plan view of the rotary disk unit 120 in FIG. 4. The rotary disk unit 120 is located below the gas spray unit 140, and provided with a plurality of wafer susceptors 122 for receiving wafers 124. For example, 4 wafer susceptors 122 may be fixed to the upper surface of the rotary disk unit 120. More specifically, the rotary disk unit 120 includes the plural wafer susceptors 122 fixed to the upper surface of the rotary disk unit 120, the disk driving unit (not shown) located at the central portion of the rotary disk unit 120 for inducing the vertical and rotary movements of the rotary disk unit 120, and a heater installed within the rotary disk unit 120.

The rotation of the rotary disk unit 120 serves to uniformly feed the reactive gases to the entire surface of the wafers 124, and to control a cycle for supplying various reactive gases and removing the remaining gases after the reaction formerly controlled by complicated manipulation using a plurality of valves in a conventional PEALD apparatus.

Figure 6:
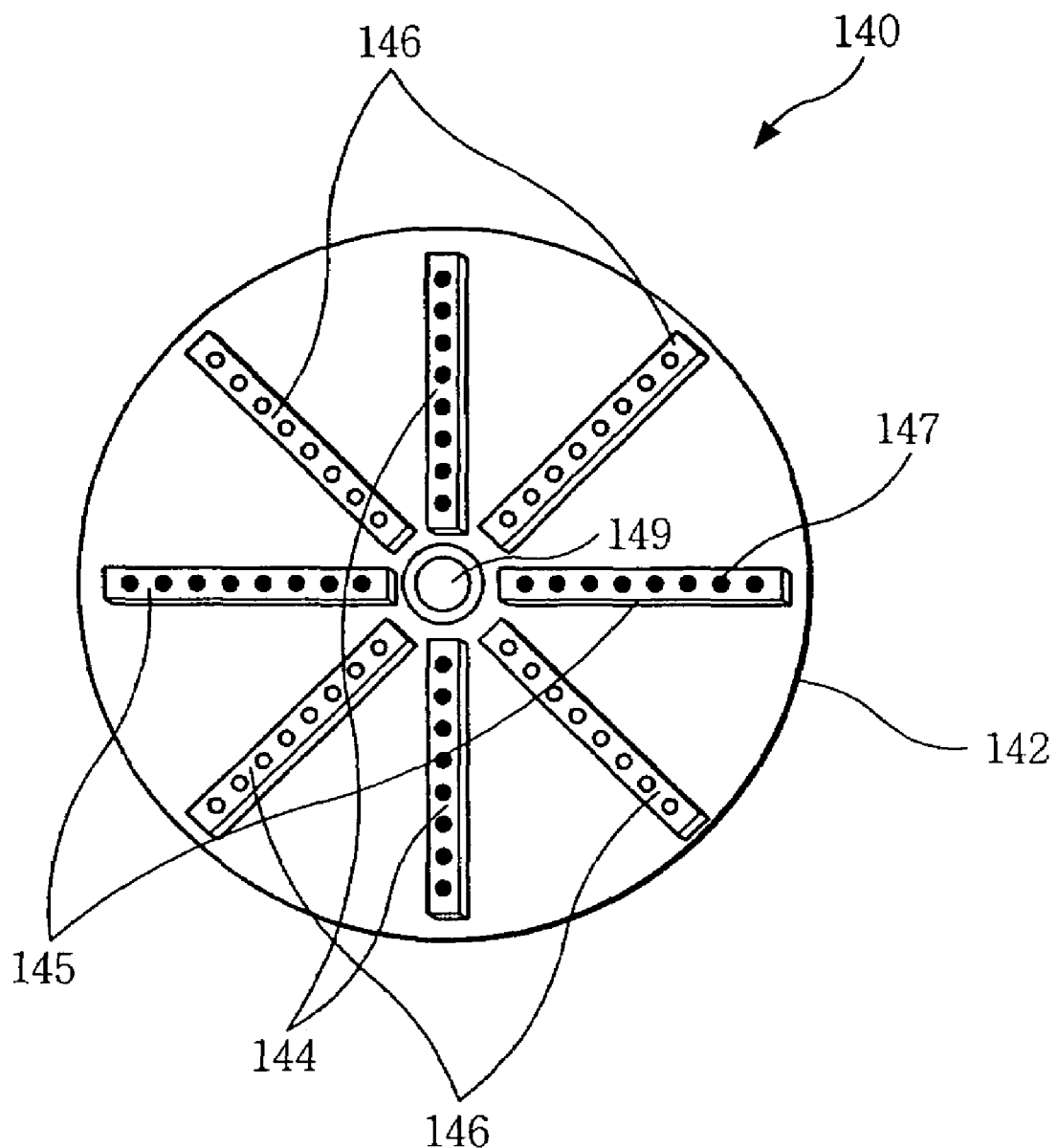
FIG. 6 is a schematic view of a gas spray unit of the ALD apparatus of FIG. 4.

FIG. 6 is a plan view of the gas spray unit 140 in FIG. 4. The gas spray unit 140 includes eight arms for forming a thin film using two gases.

First, the eight arms, serving as gas sprayers, are installed on the lower surface of a disk 142 mounted on the upper part of the housing 100. Two arms 144, which are shown vertically on the FIG. 6, serve to spray a first reactive gas, and two arms 145 shown horizontally in perpendicular to the arms 144 serve to spray a second reactive gas. Four arms 146, which are interposed between the arms 144 and 145, serve to spray a purge gas. A purge gas exhaust port 149 for preventing the mixing of the first and second reactive gases is formed at the central portion of the disk 142.

A plurality of the spray holes 147 of a predetermined size are formed on each of the arms 144, 145, 146 so that the spray holes 147 are spaced apart each other by a predetermined distance. The arms 144, 145 and 146, and the purge gas exhaust port 149 are connected to the gas feed unit 160 by connection pipes, respectively.

The purge gas exhaust port 149 is formed along the entire circumference of the disk 142, and serves to induce the reactive gases to be exhausted to the outside and to flow uniformly.

The gas spray unit 140 located at the upper end of the PEALD apparatus is mounted on the upper part of the housing 100, and includes a plurality of gas sprayers (not shown) for spraying the first reactive gas, the second reactive gas, and an inert gas.

The gas spray unit 140 is located at the upper end of the PEALD apparatus. The arms 144, 145 and 146 for respectively spraying the first and second reactive gases and the inert gas are alternately arranged on the disk 142, thus preventing the first and second reactive gases from being mixed and allowing the remaining amount of the first and second reactive gases to be effectively removed from the upper surfaces of the wafers.

In this embodiment of the present invention, the total number of the arms 144, 145 and 146 is eight, and the arms 144, 145 and 146 are installed such that the arms 144, 145 and 146 are respectively opposed to each other with respect to the center of the disk 142. As shown in FIG. 6, each of the arms 144, 145 and 146 is made of a bar-shaped member having a predetermined length corresponding to the size of the wafer, as shown in the FIG. 6.

The plasma system 180 for generating plasma to excite the second reactive gas is installed at the outside of the housing 100. In order to convert the second reactive gas into a plasma state, the second reactive gas passes through the plasma system 180 at the connection pipe for the second reactive gas. Thereafter, the second reactive gas in the plasma state is sprayed onto the wafer through the second reactive gas spray arms 145.

Here, the second reactive gas may be converted into the plasma state between the second reactive gas spraying arms 145 and the wafer. Further, the arms 144, 145 and 146 need not be formed in a bar shape, but may be formed in other shapes suitable for a PEALD process, for example, a funnel shape.

Figure 7:
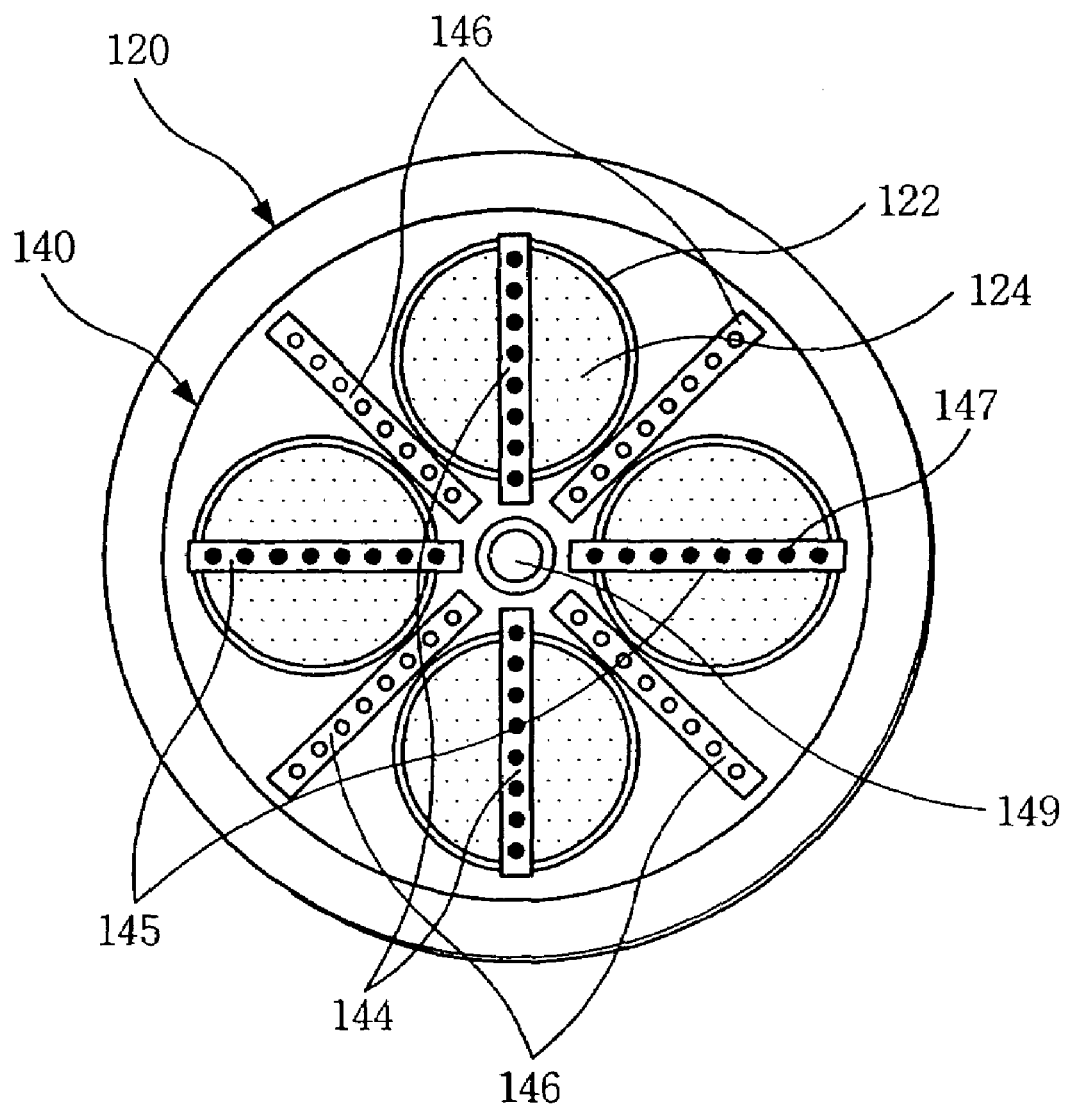
FIG. 7 is an assembled schematic view of the rotary disk unit and the gas spray unit in an operating state of the ALD apparatus of FIG. 4.

FIG. 7 is an assembled schematic view of the rotary disk unit 120 and the gas spray unit 140 in an operating state of the PEALD apparatus of the present invention. Here, the arms 144, 145 and 146 are formed so that the sizes of the arms 144, 145 and 146 correspond to the sizes of the wafers, and four wafers are mounted at respective areas on the disk 142 for the convenience of the PEALD process.

In FIG. 4, the gas feed unit 160 includes the first reactive gas container 161 and the second reactive gas container 162 and the purge gas container 163 depending on the types of the desired thin films to be deposited on the wafers. The gas feed unit 160 further includes valves 164, 165 and 166 for controlling the flow rate of the gas on the respective containers 161, 162 and 163. The plasma system 180 is located between the second reactive gas container 162 and the gas spray unit 140.

<PEALD process>

Hereinafter, a process using the above PEALD in accordance with the present invention will be described in detail.

Figure 8:
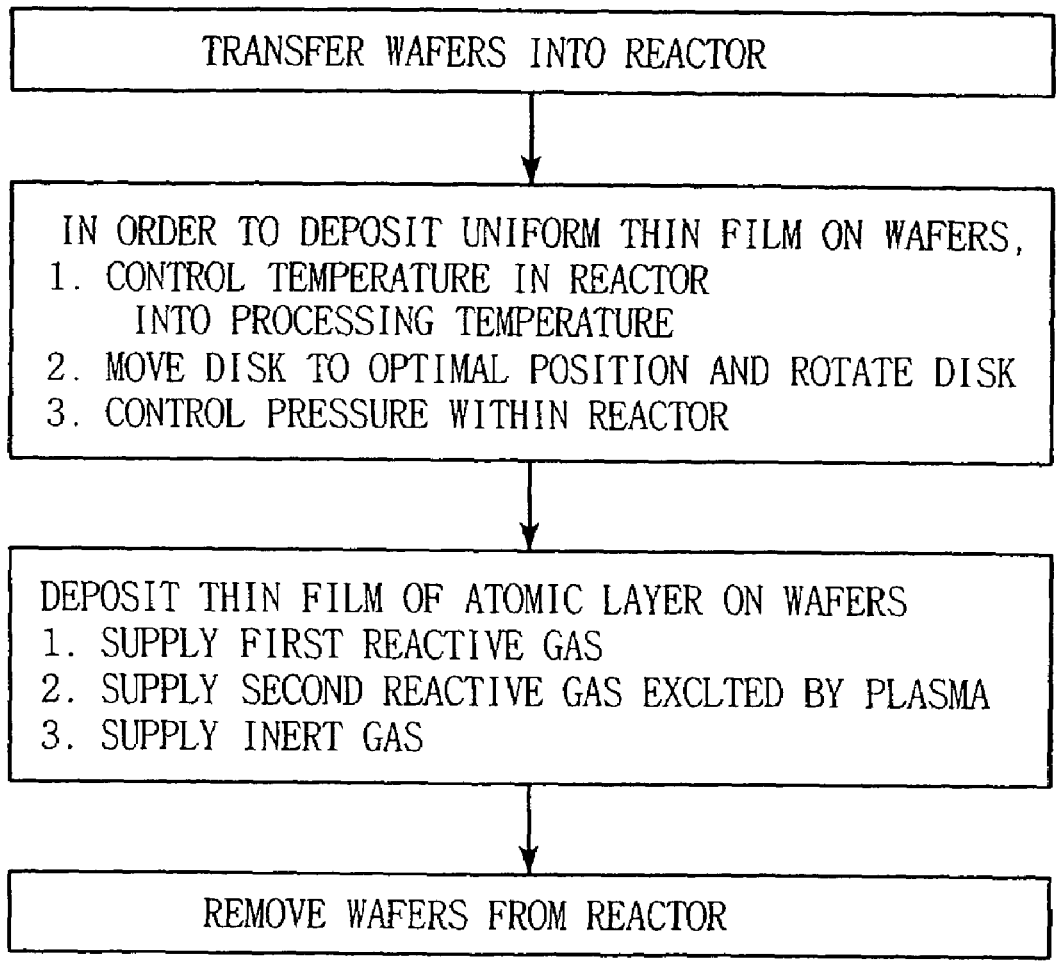
FIG. 8 is a flow chart of an ALD process in accordance with the present invention.

FIG. 8 is a flow chart of the PEALD process in accordance with the present invention.

First, wafers to be deposited with a thin film are transferred into a housing serving as a reactor, and mounted on respective wafer susceptors. Then, a temperature in the reactor is controlled so that a deposition temperature is maintained. The rotary disk unit 120 moves such that the susceptors having the wafers mounted thereon are located at optimal positions, and then is rotated at a predetermined speed.

Thereafter, a deposition step is performed by supplying a first reactive gas, a second reactive gas excited by plasma, and an inert gas simultaneously to the upper surface of the wafers, thus allowing a thin film to be deposited thereon. Then, the supply of the first and second reactive gases and the inert gas is stopped, and the upper surfaces of the wafers are purged. The wafers having thin film deposited thereon are transferred to the outside and loaded outdoors. Here, preferably, the rotational speed of the rotary disk unit 120 is in the range of about 1 rpm to about 100 rpm so that the thin film deposited on the upper surfaces of the wafers has a uniform thickness. That is, in case that the rotational speed of the rotary disk unit 120 is too high, it is difficult to allow the gas to be absorbed onto the wafer to a saturated state, thus decreasing the uniformity in the thickness of the obtained thin film. On the other hand, in case that the rotational speed of the rotary disk unit 120 is too low, the obtained thin film has a uniform thickness, but the gases are unnecessarily wasted. Further, in this case, the excess gases are absorbed onto neighboring wafers, thus lowering the quality of the deposited thin film and contaminating the reactor. Accordingly, the inside of the housing 100 adapted as the reactor is maintained so that it has a pressure that ranges from about 10 mTorr to about 100 Torr and a temperature that ranges from about 20° C. to about 500° C.

In accordance with another embodiment of the present invention, after a thin film is formed on a substrate (i.e., a wafer) using the above PEALD apparatus, an in-situ plasma procedure can be performed. This plasma procedure is a step of processing the surface of the thin film, and serves to decrease defects and improve the quality of the thin film. For such plasma procedure, a gas such as oxygen, argon, nitrogen, hydrogen, etc, which is excited by the plasma system, is used.

Figure 9:
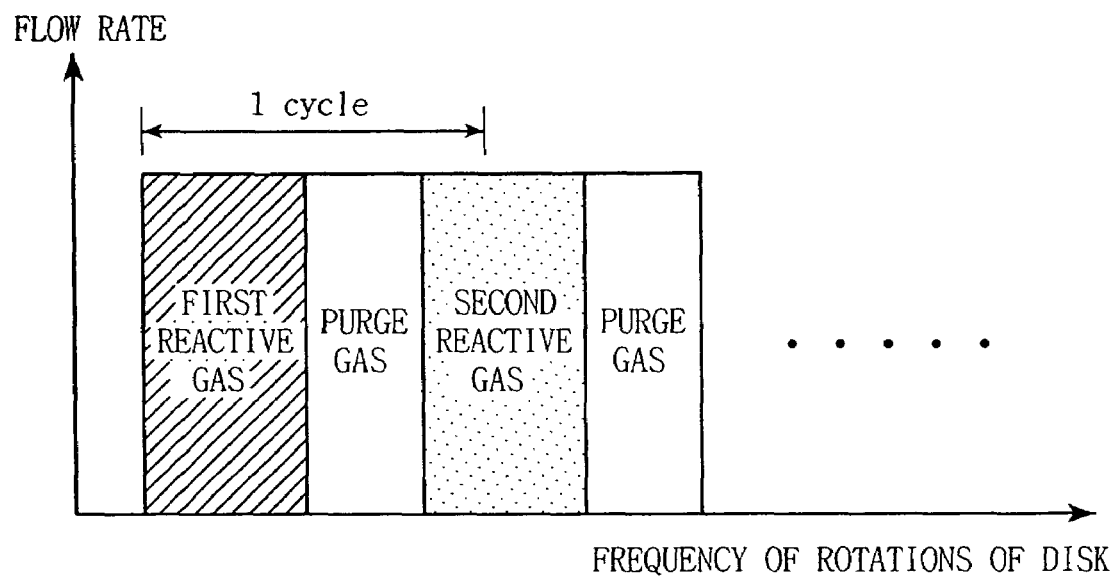
FIG. 9 is a graph illustrating flow rates of gases in accordance with respective steps of the ALD process in accordance with the present invention.

FIGS. 10a to 10d are plan views of the rotary disk unit 120 during the PEALD process in accordance with the present invention. FIG. 9 is a graph illustrating flow rates of gases in accordance with respective steps of the PEALD process of a first wafer in accordance with the present invention.

Four wafers 124a, 124b, 124c and 124d are positioned on the rotary disk unit 120, and the gases are sprayed onto the four wafers 124a, 124b, 124c and 124d via respective arms. Now, the PEALD process for the first wafer 124a as a representative wafer shown by hatched lines will be described.

Figure 10A:
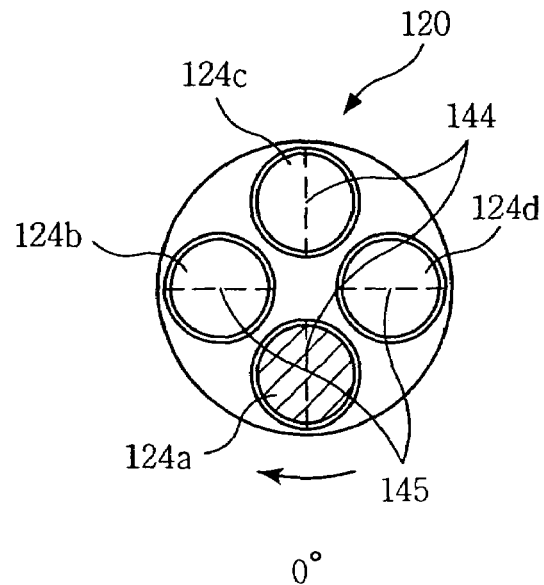
FIGS. 10a to 10d are plan views of the rotary disk unit of FIG. 5 during the ALD process in accordance with the present invention.

First, the initial location of the rotary disk unit 120 loaded with wafers 124a-124d is the angle of 0 degree. At this time, the first wafer 124a and the third wafer 124c are positioned where the first reactive gas sprayers are located, thus reacting with the first reactive gas (FIG. 10a).

Figure 10B:
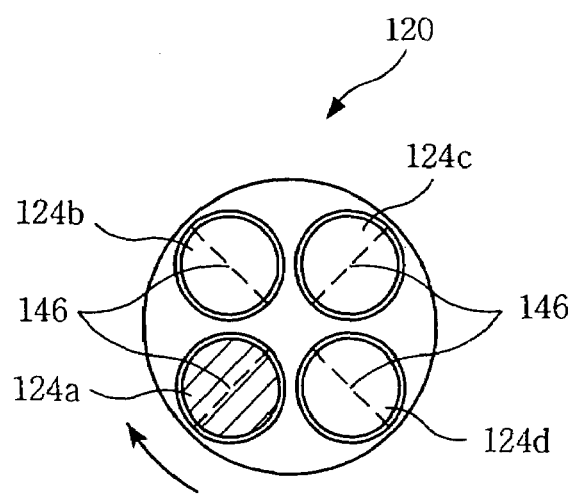

When the rotary disk unit 120 is rotated from an angle of 0 degree to reach to an angle of 45 degrees, then the first and third wafers 124a and 124c are positioned where the inert gas sprayers are located, thus allowing the excess amount of the first reactive gas on the upper surfaces of the first and third wafers 124a and 124c to be removed (FIG. 10b).

Figure 10C:
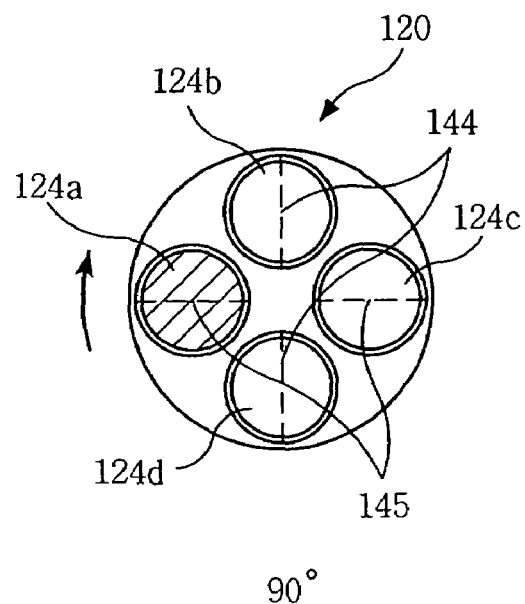

Subsequently, when the rotary disk unit 120 is rotated from an angle of 45 degrees to reach to an angle of 90 degrees in clockwise sense. Then the first and third wafers 124a and 124c are positioned where the second reactive gas sprayers are located, thus reacting with the second reactive gas excited by plasma (FIG. 10c).

Figure 10D:
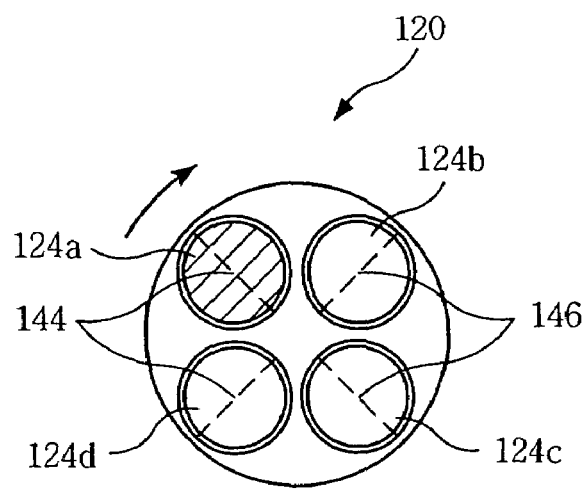

Next, the rotary disk unit 120 is rotated from an angle of 90 degrees to reach to an angle of 135 degrees. Then, the first and third wafers 124a and 124c are positioned where the inert gas sprayers are located, thus allowing the excess amount of the second reactive gas on the upper surfaces of the first and third wafers 124a and 124c to be removed by such inert gas (FIG. 10d).

In this way, as the rotary disk unit 120 rotates, the first reactive gas and the second reactive gas excited by plasma are alternately supplied to the first and third wafers 124a and 124c.

Further, in the same manner as for the first and third wafers 124a and 124c, the first reactive gas and the second reactive gas excited by plasma are alternately supplied to the second and fourth wafers 124b and 124d.

When the first, second, third and fourth wafers 124a, 124b, 124c and 124d are rotated by an angle of 135 degrees in the above-described manner, one cycle of the PEALD process is completed. A thin film with a desired thickness can be deposited on the first, second, third and fourth wafers 124a, 124b, 124c and 124d by repeating the above cycle.

In the present PEALD process, a stable and uniform thin film with an adjustably fine thickness can be obtained by controlling the rotational speed of the rotary disk unit, the amount of the supplied gases, and the number of repetitions of the cycle.

In addition, before the thin film is deposited on the wafers 124a, 124b, 124c and 124d, a clearing step can be performed. More specifically, after the wafers 124a, 124b, 124c and 124d are placed on the rotary disk units 120, a clearing gas excited by plasma is supplied into the reactor, thus removing particles or foreign substances from the upper surfaces of the wafers 124a, 124b, 124c and 124d. Further, an in-situ clearing step may be performed by supplying the clearing gas excited by plasma into the reactor, after removing the wafers 124a, 124b, 124c and 124d from the reactor.

In the PEALD process of the present invention, since the first reactive gas and the second reactive gas excited by plasma are simultaneously supplied to the reactor, these gases may be mixed due to the diffusion of gases, thus causing the reaction of these gases. Accordingly, in order to suppress the reaction of the gases while allowing the thin film of an atomic layer to be deposited on the surface of the wafer, an electronic showerhead can be installed in the PEALD apparatus so that the second reactive gas can be imparted with energy only in a certain area.

Figure 11:
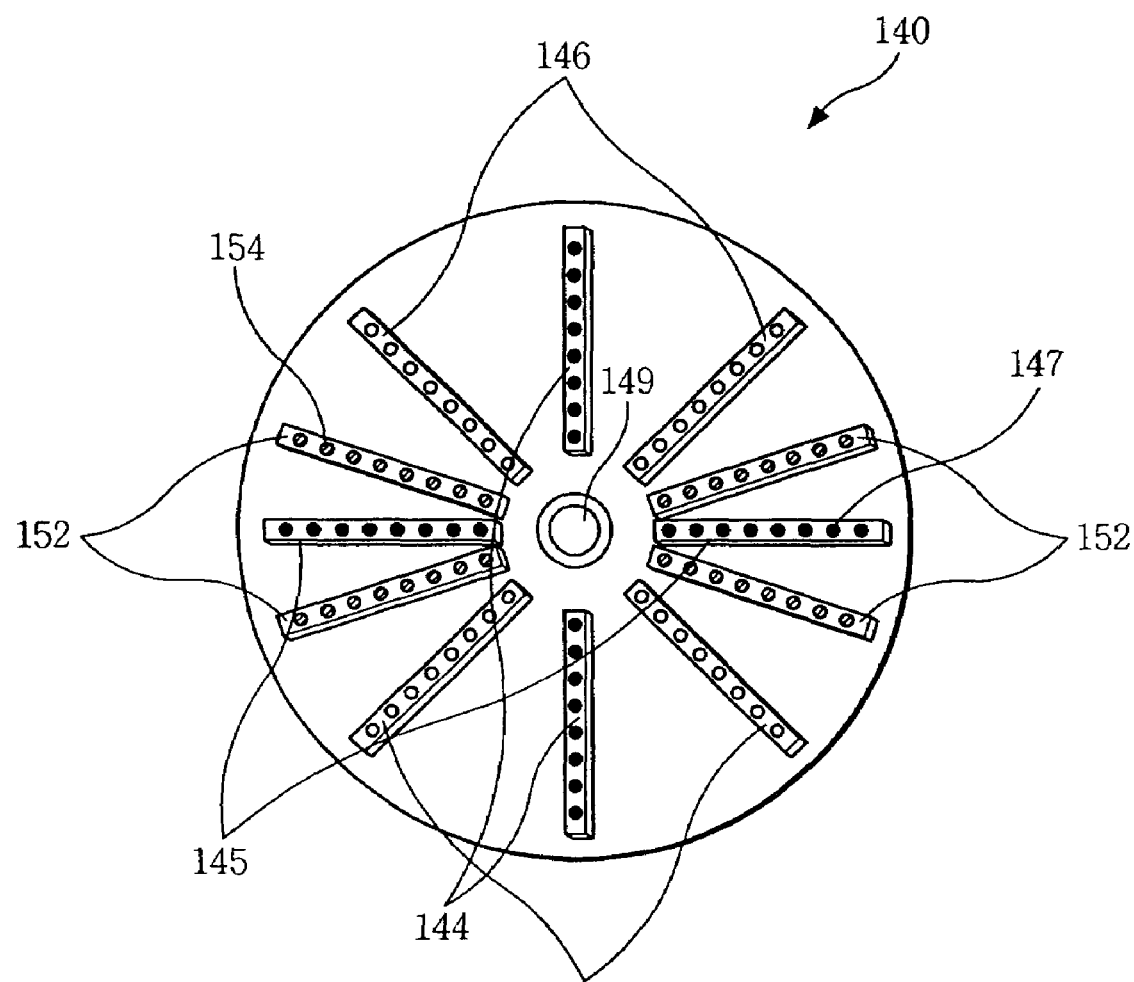
FIG. 11 is a plan view of a gas spray unit of the ALD apparatus in accordance with another embodiment or the present invention.
Figure 12:
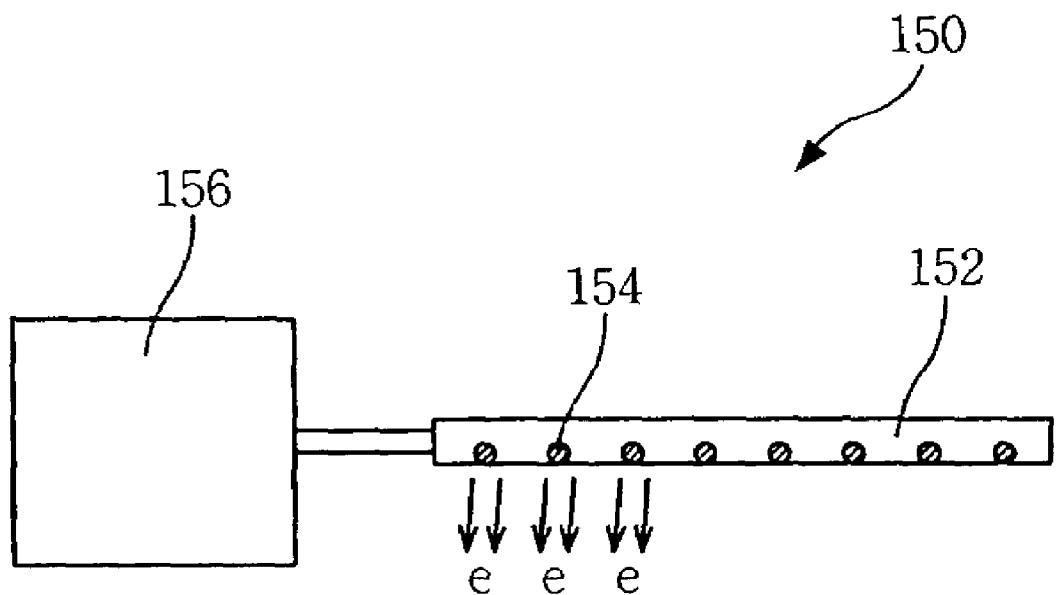
FIG. 12 is a schematic view of an electric showerhead connected to an electronic spray arm shown in FIG. 11.

FIGS. 11 and 12 illustrate another embodiment of the present invention.

Arms 152 for an electronic showerhead 150 are installed on both sides of the second reactive gas spray arms 145 of the disk 142, and electronic exhaust holes 154 of a predetermined size are formed on the electronic shower arms 152 so that the electronic exhaust holes 154 are spaced apart each other The electronic shower arms 152 are connected to an external electronic generator 156.

The electronic showerhead 150 continuously discharges electrons through the electronic exhaust holes 154 during the deposition of the thin film, thus converting the second reactive gas into neutrons before the second reactive gas excited by plasma is mixed with the first reactive gas. Therefore, since the second reactive gas has lost its energy, even when the second reactive gas is mixed with the first reactive gas, the reaction between the first and second reactive gases does not occur. Accordingly, it is possible to realize thin films of atomic layers under controlled gas reactions.

EMBODIMENTS OF PEALD PROCESS

The PEALD process of the present invention achieved by the PEALD apparatus comprises several examples, such as unit element thin film deposition, oxide thin film deposition, nitride thin film deposition, carbide thin film deposition, etc.

Here, the first reactive gas is one selected from the group consisting of Al, Si, Ti, Ga, Ge, Co, Sr, Y, Zr, Nb, Ru, Ba, La, Hf, Ta, Ir, Pb, Bi, W, and their compounds. The second reactive gas varies depending on the types of the thin film to be deposited, such as single element, carbide, nitride and oxide.

Unit element thin film deposition

In case that a thin film of a unit element is deposited on a wafer, hydrogen gas is used as the second reactive gas. The hydrogen gas activated by plasma reduces the first reactive gas absorbed into the upper surface of the wafer, thereby allowing an atomic layer of unit element to be deposited on the wafer.

Oxide thin film deposition

In case that an oxide thin film is deposited on a wafer, hydrogen, $N_2O$ or their compound gas is used as the second reactive gas. The second reactive gas excited by plasma is supplied to the wafer, and the supplied second reactive gas converts the first reactive gas absorbed onto the upper surface of the wafer into an oxide layer, thereby allowing an oxide thin film to be deposited on the wafer.

Nitride thin film deposition

In case that a nitride thin film is deposited on a wafer, nitrogen or ammonia gas is used as the second reactive gas. The second reactive gas excited by plasma is supplied to the wafer, and the supplied second reactive gas converts the first reactive gas absorbed onto the upper surface of the wafer into a nitride layer, thereby allowing a nitride thin film to be deposited on the wafer.

Carbide thin film deposition

In case that a carbide thin film is deposited on a wafer, hydrocarbon gas such as methane, ethane, propane, etc. is used as the second reactive gas. The second reactive gas excited by plasma is supplied to the wafer, and the supplied second reactive gas converts the first reactive gas absorbed onto the upper surface of the wafer into a carbide layer, thereby allowing a carbide thin film to be deposited on the wafer.

Carbide thin film deposition

In case that carbide thin film is depositrd on a wafer, hydrocarbon gas such as methane, ethane, propane, etc. is used as the second reactive gas. The second reactive gas excited by plasma is supplied to the wafer,and the supplied second reactive gas converts the first reactive gas absorbed onto the upper surface of the wafer into a carbide layer, threrby allowing a carbide thin film to be deposited on the wafer.

Three component thin film deposition

In case that a thin film of three components is deposited on a wafer, the gas spray unit includes first gas sprayers, second gas sprayers, third gas sprayers, and inert gas sprayers arranged alternately on a disk, instead of gas spray unit of eight arms. In order to deposit the thin film of three components on the wafer, the first and third reactive gases are respectively selected from the group consisting of Al, Si, Ti, Ga, Ge, Co, Sr, Y, Zr, Nb, Ru, Ba, La, Hf, Ta, Ir, Pb, Bi, W, and their compounds, and gas excited by plasma is used as the second reactive gas.

In order to maintain the stable plasma state of the second reactive gas, when the second reactive gas is supplied to the wafer, one or more gases selected from the group consisting of He, $N_2$, and Ar gases may be mixed with the second reactive gas.

In this embodiment, the first reactive gas and the second reactive gas excited by plasma are always supplied to the wafers at a constant amount during the PEALD process. Further, with the rotation of the disk, the first reactive gas, the purge gas, the second reactive gas excited by plasma, the purge gas, the third reactive gas, and the purge gas are sequentially supplied to the surfaces of the wafers.

As apparent from the above description, the present invention provides a PEALD apparatus comprising a plurality of gas sprayers arranged radially and a rotary disk having wafers loaded thereon and located below the gas sprayers, in which reactive gases are supplied simultaneously to the wafers not by controlling valves of a gas supply line but by rotating the rotary disk, thereby controlling the repetition number of the cycle of a thin film deposition process according to the rotational speed of the rotary disk. Accordingly, the PEALD apparatus of the present invention is advantageous in solving such problems as system instability, difficulty in adjusting the thickness of the thin film to be obtained, and increase in the production cost due to the short service life of the valves in an conventional PEALD apparatus for depositing a thin film using valve control means, and improves the quality of the thin film obtained.

The PEALD apparatus of the present invention controls reactive gases and a purge gas to be supplied into a reactor at a constant speed and a precise flow rate, thus ensuring the stability in the PEALD process.

The PEALD apparatus of the present invention simultaneously supplies all reactive gases to the reactor during the atomic layer deposition process, thereby preventing the degradation of stability resulting from the variations of a pressure occurring when the gases are sequentially supplied to the reactor by the conventional valve control means.

The PEALD apparatus of the present invention simultaneously supplies all reactive gases into the reactor during the atomic layer deposition process, thereby preventing the delay of the process time caused by the limited speed and delay of the valve manipulation and ensuring increased process speed.

The PEALD apparatus of the present invention continuously generates plasma for exciting the second reactive gases, thereby preventing the decrease in the service life of a plasma system and the instability of the plasma system caused by the frequent power ON/OFF manipulation of the conventional plasma system.

The PEALD apparatus of the present invention simultaneously deposits a thin film on each of the plural wafers, thereby overcoming problems caused by a conventional ALD method having low productivity.

The PEALD apparatus of the present invention performs an in-situ plasma procedure on the wafers having thin films deposited thereon, thereby improving the physiochemical properties of the deposited thin film of an atomic layer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A PEALD (plasma enhanced atomic layer deposition) method using a PEALD apparatus including:
a housing including a reaction chamber in which a deposition reaction is performed; a rotary disk unit installed in the housing and provided with a plurality of susceptors for receiving wafers thereon so as to move the wafers; a gas spray unit mounted on the upper end of the housing above the rotary disk unit, and provided with first reactive gas sprayers, second reactive gas sprayers and inert gas sprayers on a lower surface of a circular disk for spraying respective gases into the housing; a gas feed unit connected to the gas spray unit for supplying first and second reactive gases and a purge gas into the housing; a gas exhaust port formed around the rotary disk unit; and a plasma generator for generating plasma to excite the second reactive gas, that PEALD method comprising:
mounting a plurality of wafers to be deposited with a thin film on susceptors of a rotary disk unit;
maintaining a deposition temperature by controlling the temperature in the housing;
vertically moving the rotary disk unit to a position corresponding to a gas spray unit;
rotating the rotary disk unit; and
depositing the thin film on the upper surfaces of the wafers by spraying a first reactive gas, a second reactive gas excited by plasma and an inert gas through spray holes of the gas spray unit, wherein:
the second reactive gas comprises hydrogen gas so as to deposit a unit element thin film on the wafers, one selected from the group consisting of $N_2$ and $NH_3$ gases so as to deposit a nitride thin film on the wafers, one selected from the group consisting of oxygen and $N_2O$ gases so as to deposit an oxide thin film on the wafers, and one selected from the group consisting of methane, ethane, and propane gases so as to deposit a carbide thin film on the wafers; and
the second reactive gas is excited by plasma and then supplied into the reactor.

2. The PEALD method as set forth in claim 1,
wherein the rotary disk unit has a rotational speed that ranges from about 5rpm to about 100rpm, and an inside of the housing is maintained such that it has a pressure that ranges from about 10mTorr to about 100Torr and a temperature that ranges from about 25°C. to about 500°C.

3. The PEALD method as set forth in claim 1,
wherein the first reactive gas is one selected from the group consisting of Al, Si, Ti, Ga, Ge, Co, Sr, Y, Zr, Nb, Ru, Ba, La, Hf, Ta, Ir, Pb, Bi, W, and compounds thereof.

4. The PEALD method as set forth in claim 1, further comprising an in-situ plasma-processing after depositing the thin film.

5. The PEALD method as set forth in claim 4,
wherein a gas for using during in-situ plasma-processing is one selected from the group consisting of Ar, $N_2$, $O_2$ and $H_2$.

6. The PEALD method as set forth in claim 2, further comprising clearing the wafers with a clearing gas excited by plasma so as to remove particles or foreign substances from the surfaces of the wafers, prior to depositing the thin film.

7. The PEALD method as set forth in claim 2, further comprising an in-situ clearing of removing the thin film deposited on the inside of the reactor using the plasma system.

* * * * *